(12) United States Patent
Ledezma et al.

(10) Patent No.: US 10,130,016 B2
(45) Date of Patent: Nov. 13, 2018

(54) MODULAR SIZE MULTI-MEGAWATT SILICON CARBIDE-BASED MEDIUM VOLTAGE CONVERSION SYSTEM

(71) Applicant: TECO-Westinghouse Motor Company, Round Rock, TX (US)

(72) Inventors: Enrique Ledezma, Austin, TX (US); Ryan Edwards, Round Rock, TX (US); Paulo Guedes-Pinto, Round Rock, TX (US); Bhaskara Palle, Round Rock, TX (US); Randall Pipho, Leander, TX (US); Alex Skorcz, Cedar Park, TX (US)

(73) Assignee: TECO—Westinghouse Motor Company, Round Rock, TX (US)

( * ) Notice: Subject to any disclaimer, the term of this patent is extended or adjusted under 35 U.S.C. 154(b) by 0 days.

(21) Appl. No.: 15/686,508

(22) Filed: Aug. 25, 2017

(65) Prior Publication Data

US 2018/0064001 A1    Mar. 1, 2018

Related U.S. Application Data

(60) Provisional application No. 62/379,982, filed on Aug. 26, 2016.

(51) Int. Cl.
*H05K 7/20* (2006.01)
*H02M 5/458* (2006.01)
(Continued)

(52) U.S. Cl.
CPC ........ *H05K 7/20936* (2013.01); *H02M 5/225* (2013.01); *H02M 5/458* (2013.01);
(Continued)

(58) Field of Classification Search
CPC . G06F 1/181–1/182; H05K 7/20218–7/20381;
(Continued)

(56) References Cited

U.S. PATENT DOCUMENTS

| 8,644,037 B2 | 2/2014 | Raju et al. |
| 2006/0152085 A1* | 7/2006 | Flett ......................... B60L 9/30 307/75 |

(Continued)

OTHER PUBLICATIONS

Bhattacharya, et al., "Design development of generation-I silicon based solid state transformer", IEEE APEC 2010 Twenty-Fifth Annual Conference, pp. 1666-1673, 2010.

(Continued)

*Primary Examiner* — Anthony Haughton
*Assistant Examiner* — Razmeen Gafur
(74) *Attorney, Agent, or Firm* — Trop, Pruner & Hu, P.C.

(57) ABSTRACT

In one embodiment, a power cell module includes: a high frequency line converter (HFLC) to receive a phase of input power from a utility source, the HFLC including a first silicon carbide (SiC) stage and a second SiC stage; a transformer having a primary coil coupled to the HFLC and a secondary coil coupled to a high frequency motor converter (HFMC); the HFMC to output a phase of output power to a load, the HFMC including a third SiC stage and a fourth SiC stage; and a two-phase cooling system having conduits that are adapted to provide a flow of cooling media through the HFLC, the transformer and the HFMC.

20 Claims, 11 Drawing Sheets

(51) Int. Cl.
*H02M 5/22* (2006.01)
*H01L 23/473* (2006.01)
*H02P 27/06* (2006.01)
*H02M 7/49* (2007.01)

(52) U.S. Cl.
CPC ............ *H02M 5/4585* (2013.01); *H02M 7/49* (2013.01); *H02P 27/06* (2013.01)

(58) Field of Classification Search
CPC ........................ H05K 7/20409–7/20418; H05K 7/20009–7/202; H01L 23/367–23/3677; H01L 23/473; H01L 23/46–23/467
USPC ...... 361/676–678, 679.46–679.54, 688–723, 361/699–704, 709–710, 719–721; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 2006/0233000 A1* | 10/2006 | Akagi | ................. | H02M 5/4585 363/37 |
| 2008/0266042 A1* | 10/2008 | Yoshimura | .......... | H01F 27/2804 336/181 |
| 2009/0196764 A1* | 8/2009 | Fogarty | ............... | F04D 25/0606 417/44.1 |
| 2009/0200290 A1* | 8/2009 | Cardinal | .................. | E21B 43/24 219/488 |
| 2012/0051100 A1* | 3/2012 | Alexander | .......... | H02M 3/1582 363/37 |
| 2012/0146437 A1* | 6/2012 | Kernahan | ............... | H02K 47/30 310/71 |
| 2012/0223792 A1* | 9/2012 | MacLennan | ............ | H01F 27/06 336/55 |
| 2012/0250369 A1* | 10/2012 | Furukawa | .......... | H02M 3/33584 363/25 |
| 2012/0262953 A1* | 10/2012 | Jungreis | ................. | H02M 3/285 363/17 |
| 2013/0063184 A1* | 3/2013 | Liang | .................. | H01L 21/8213 327/108 |
| 2013/0258729 A1* | 10/2013 | Barbosa | .................. | H02M 5/14 363/71 |
| 2014/0036418 A1* | 2/2014 | Eichler | ................. | H05K 7/1432 361/605 |
| 2014/0146582 A1* | 5/2014 | Gupta | ................. | H02M 7/7575 363/35 |
| 2014/0176088 A1* | 6/2014 | Eckhardt | ............... | H02J 3/1814 323/207 |
| 2015/0003124 A1* | 1/2015 | Sakai | ...................... | H02M 1/12 363/37 |
| 2015/0357946 A1* | 12/2015 | Farr | ........................ | H02M 5/44 318/400.3 |
| 2015/0365003 A1* | 12/2015 | Sadwick | ................. | H02M 3/28 363/21.01 |
| 2016/0195891 A1* | 7/2016 | Divan | ..................... | H01F 29/02 323/301 |
| 2016/0197566 A1* | 7/2016 | Alvey | .................. | F25B 49/025 318/781 |
| 2016/0203907 A1* | 7/2016 | Handy | .................. | H01F 41/005 29/605 |
| 2016/0204689 A1* | 7/2016 | Wennerstrom | ............ | H02P 6/14 318/400.26 |
| 2017/0040890 A1* | 2/2017 | Barkley | ................. | H02M 3/155 |
| 2017/0045249 A1* | 2/2017 | Lee | ......................... | H02M 7/04 |
| 2017/0126114 A1* | 5/2017 | MacLennan | .......... | H02M 1/126 |
| 2017/0126163 A1* | 5/2017 | Liang | ...................... | H02P 25/06 |
| 2017/0163042 A1* | 6/2017 | Naiknaware | ........ | H02M 7/4807 |
| 2017/0261246 A1* | 9/2017 | Park | ....................... | H02P 21/22 |
| 2017/0366082 A1* | 12/2017 | Liu | ............................ | H02P 7/04 |
| 2018/0026550 A1* | 1/2018 | Dent | ...................... | H02J 3/383 363/56.01 |

OTHER PUBLICATIONS

Madhusoodhanan, et al., "Solid-state transformer and MV grid tie applications enabled by 15 kV SiC IGBTs and 10kV SiC MOSFETS based multilevel converters", IEEE Transactions on Industry Applications, vol. 51, No. 4, Jul./Aug. 2015.

Kheraluwala et al., "Performance characterization of a high-power dual active bridge dc-to-dc-converter", IEEE Trans. Ind. Appl., vol. 28, No. 6, pp. 1294-1301, Nov./Dec., 1992.

Giri et al., "Input-series and output-series connected modular DC-DC converter with active input voltage and output voltage sharing", IEEE APEC'04, vol. 3, pp. 1751-1756, 2004.

Choudhary, et al., "Fault tolerant and control method for input—series and output—parallel modular DC-DC, converters", IEEE Trans. on Ind. Appl., vol. 23, No. 1, pp. 402-411, 2008.

Falcones, et al., "Topology comparison for solid state transformer implementation", IEEE 2010 PES General Meeting, pp. 1-8, Jul. 2010.

Yaskawa Electronic Corporation, "Super Energy-Saving Medium-Voltage Matrix Converter With Power Regeneration, FSDrive-MX1S, 3 kV 200 to 3000 kVA, 6kV 400 to 6000 kVA", Drives and Motion Division, 2010.

* cited by examiner

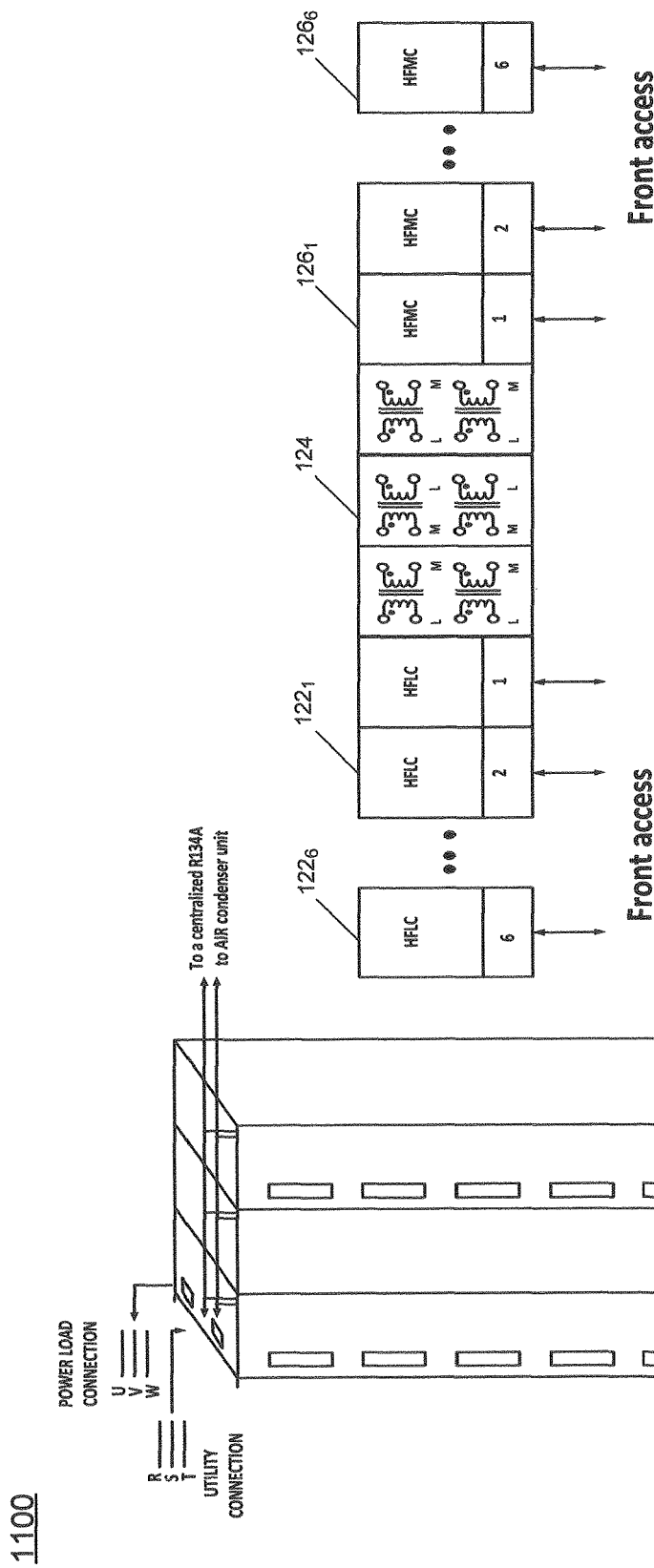

MODULAR SIZE MULTI-MEGAWATT SILICON CARBIDE-BASED MEDIUM VOLTAGE CONVERSION SYSTEM

This application claims the benefit of U.S. Provisional Application No. 62/379,982, filed on Aug. 26, 2016, in the name of Enrique Ledezma, Ryan Edwards, and Paulo Guedes-Pinto entitled "Modular Reduced-Size Multi-MW SiC-Based Medium Voltage Conversion System."

BACKGROUND

Among suitable candidate topologies for implementation of a reduced size medium voltage drive system, solid state transformer concept and matrix converter configurations offer attractive features. While various proposals for a drive system including a solid state transformer (SST) have been made, to date there are not suitable commercial applications. Modular drive systems are available that use insulated gate bipolar transistor (IGBT) switching devices. However, at the frequency of switching, options for modular transformers are limited in such topologies.

SUMMARY OF THE INVENTION

In one aspect, a power cell module includes: a high frequency line converter (HFLC) to receive a phase of input power from a utility source, the HFLC including a first silicon carbide (SiC) stage and a second SiC stage; a transformer having a primary coil coupled to the HFLC and a secondary coil coupled to a high frequency motor converter (HFMC); the HFMC to output a phase of output power to a load, the HFMC including a third SiC stage and a fourth SiC stage; and a two-phase cooling system having conduits that are adapted to provide a flow of cooling media through the HFLC, the transformer and the HFMC.

In another aspect, drive system includes: a first cabinet including a plurality of HFLCs each to receive a phase of input power from a utility source and comprising a first wide bandgap stage and a second wide bandgap stage; a second cabinet including a plurality of high frequency transformers each having a primary coil coupled to one of the plurality of HFLCs and a secondary coil, the second cabinet having at least one conduit adapted about the plurality of high frequency transformers to receive a flow of coolant from a two-phase cooling system; and a third cabinet including a plurality of HFMCs each to receive a phase of output power from the secondary coil of one of the plurality of high frequency transformers and to output the phase of output power to a load, each of the plurality of HFMCs comprising a third wide bandgap stage and a fourth wide bandgap stage.

In a still further aspect, a power cell for a drive system includes: a first mobile portion including a first rectifier stage to rectify an input signal of a phase of input power received a first frequency to provide a first rectified signal and a first inverter stage having a plurality of switching devices to receive a first DC signal and output a first AC signal, where the first mobile portion is slidably adapted within a first face of a cabinet of the drive system; a fixed portion including a first DC link having a first capacitor to receive the first rectified signal and provide the first DC signal to the first inverter stage and a transformer having a primary coil to receive the first AC signal at a second frequency and a secondary coil to output the first AC signal at the second frequency; a second mobile portion including a second rectifier stage to rectify the first AC signal at the second frequency to provide a second rectified signal and a second inverter stage having a plurality of switching devices to receive a second DC signal and output a second AC signal at a third frequency to a load, where the second mobile portion is slidably adapted within a second face of the cabinet, and wherein the fixed portion further includes a second DC link having a second capacitor to receive the second rectified signal and provide the second DC signal to the second inverter stage; and a conduit system adapted through the first mobile portion, the second mobile portion and the fixed portion, where the conduit system comprises an inlet port to receive a flow of liquid coolant and an outlet port to output a flow of two-phase coolant.

BRIEF DESCRIPTION OF THE DRAWINGS

FIGS. 11A and 11B are plan drawings of medium voltage drive systems in accordance with embodiments.

DETAILED DESCRIPTION

Figure 1:
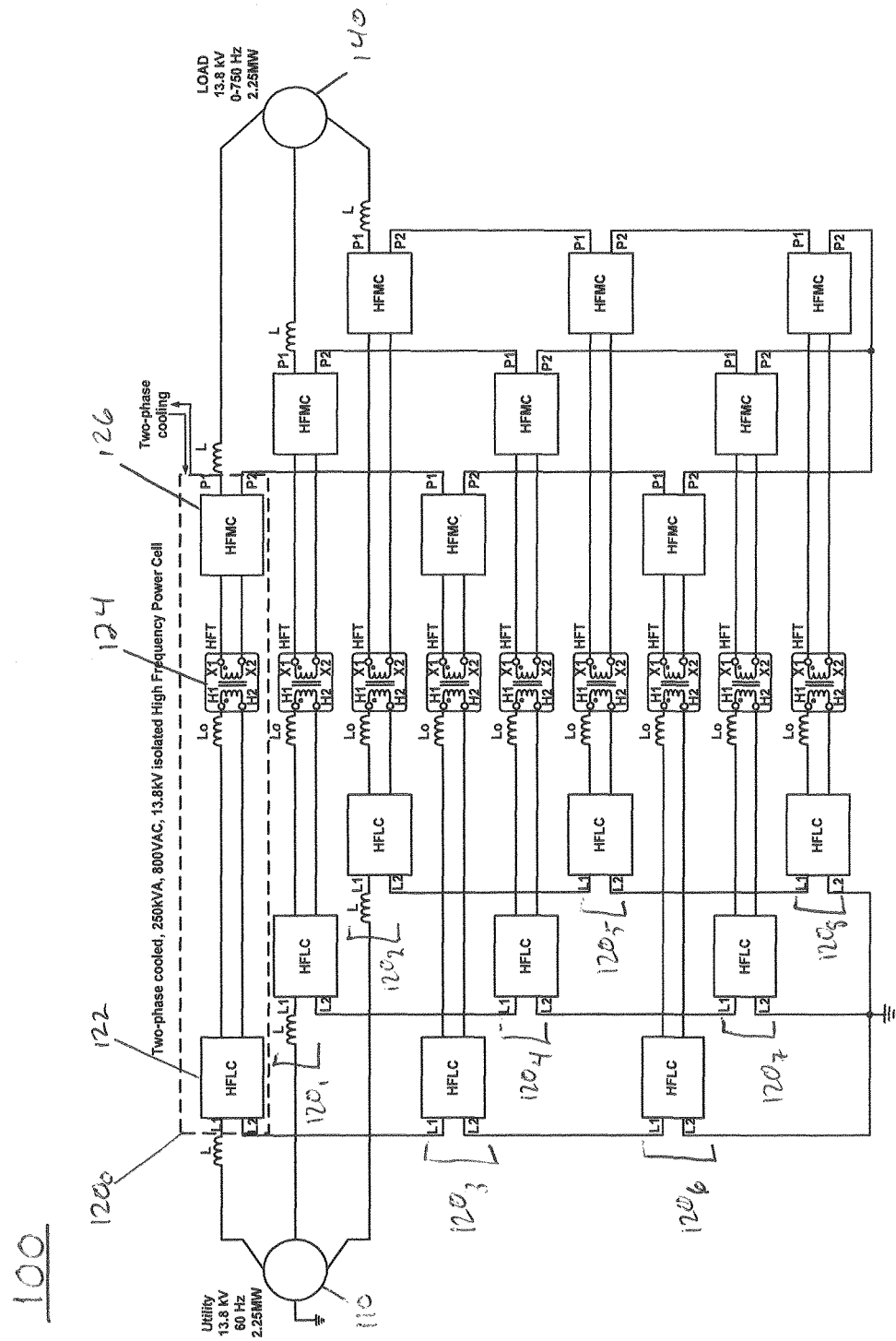
FIG. 1 is a block diagram of a medium voltage (MV) drive in accordance with an embodiment.

Referring now to FIG. 1, shown is a block diagram of a medium voltage (MV) drive in accordance with an embodiment. More specifically, as shown in FIG. 1, a modular MV converter system 100 includes multiple modular power cells $120_0$-$120_8$ (generally power cells 120). As seen, each power cell 120 couples between a utility source 110 and a load 140. In an embodiment, utility source 110 may provide an incoming source of AC power (e.g., utility power at a level of 13.8 kilovolts (kV) and at 60 Hertz (Hz)). In turn, each power cell 120 may couple to load 140, which in the embodiment shown may be implemented as a motor that operates at 13.8 kV and 750 Hz. Of course in other embodiments, other regulation possibilities exist, including upconverting and downconverting voltages and further regulating power to be provided at different frequencies.

With further reference to FIG. 1, a first power cell $120_0$ couples to a first phase (e.g., phase A) output from utility source 110. As seen, this output from utility source 110 may couple through an input inductor L to a first port L1 of power cell $120_0$. In turn, the output of power cell $120_0$ couples through an output inductor L to a first phase input of motor 140. In addition, power cell $120_0$ also has a coupling to another power cell ($120_3$), by way of input port L2 and output port P2 (that couple respectively to input port L1 and output port P1 of power cell $120_3$). As further seen, power cell $120_3$ may further couple to power cell $120_6$ in similar manner. As such, a series coupling multiple of power cells may occur for a common phase. As with these three power cells of the first phase, similar coupling between power cells $120_1$, $120_4$ and $120_7$ may occur for a second phase (e.g., phase B). Similarly power cells $120_2$, $120_5$ and $120_8$ may occur for a third phase (e.g., phase C). In other embodiments, a parallel coupling of phases of different power cells may be implemented.

Still with reference to FIG. 1, components within power cells 120 are illustrated at a high level. Specifically with reference to power cell $120_0$, included is a high frequency line converter (HFLC) 122. As will be described herein, HFLC 122 may be implemented as silicon carbide (SiC)-based converter, such as an AC-to-DC-to-AC converter. The output of HFLC 122 couples to a high frequency transformer (HFT) 124 implemented within power cell $120_0$. As illustrated, a first output port of HFLC 122 couples to a first input port of a primary side of transformer 124 via an input inductor $L_0$ which represents equivalent leakage inductance referred to the primary of HFT 124. In turn, a second output port of HFLC 122 couples to a second input port of the primary side of transformer 124. HFT 124 may be implemented as a modular transformer that switches at high frequency (e.g., between approximately 25 and 50 kilohertz (kHz)).

More specifically, the power switch speed may be determined by the selected SiC power switch (e.g., 6.5 kV class), power transfer requirements, and specific gate drive specifications of the SiC devices within HFLC 122. As further illustrated, a secondary side of HFT 124 has a first output port that couples to a first input port of a high frequency motor converter (HFMC) 126, and a second output port that couples to a second input port of HFMC 126. In an embodiment, HFMC 126 may be implemented as a SiC-based converter, such as an AC-to-DC-to-AC converter. As such, HFMC 126 outputs an AC signal.

While shown with this particular implementation in the embodiment of FIG. 1, other arrangements of a modular MV drive system in accordance with an embodiment are possible. For example a drive system can be an input-parallel and output-series implementation, an input-parallel and output-parallel implementation, or an input-series and output-parallel implementation. More specifically, these implementations may be created by connecting each HFLC and HFMC in series/parallel combinations at input/output to improve current total harmonic distortion (THD), or voltage THD. More specifically, current THD may be improved by, e.g., interleaving capability due to parallel connections. In turn, voltage THD may be realized, e.g., by interleaving capability due to series connections. For system voltage scaling capability, HFLC and HFMC's can be connected in series side fashion at the line side and motor, as illustrated in FIG. 1.

With an implementation as in FIG. 1 providing a modular medium voltage drive based on high frequency power cell modules, a modular AC drive option is realized. Embodiments may provide galvanic isolation at a high frequency, eliminating the need of a bulky 60 Hz transformer commonly used in cascaded single-phase H-bridge multi-level topologies to allow power conversion transfer. Instead, required galvanic isolation that allows the synthesis of MV output voltage waveforms is provided by a single high frequency transformer stage integrated inside of each power cell module. The size of these passive components (e.g., magnetics) may be reduced by increasing the fundamental frequency at the input of the HFT. As an example, each power cell module is isolated from each other and to a cabinet chassis at 15 kV class. Additional isolation and two-phase cooling as described herein provides electrical insulation to the power cell components including the HFT. In this way, embodiments may lead to an increase in power density and a footprint reduction. The output/input voltage waveforms can be configured by control utilizing cascaded single-phase H-bridge principles. Implementation described in FIG. 1 may lead to a compact modular MVD configuration. The true modularity at the drive input/output (series/parallel power cell connection) can potentially lead to various attractive MVD power configurations. These benefits, added to low wide bandgap (WBG) device losses may lead to a commercial and compact MV drive configuration.

Control principles can be applied based on single-phase cascaded H-bridge inverters to synthesize low harmonic content at the converter input or/and output. In this regard, current and/or voltage mode control techniques can be applied to control the power flow through the high frequency DC-DC power stage and to assure DC-link regulation. Embodiments may further implement concepts of cascaded multilevel control, fault tolerant power cells, cell redundancy, and interleaving.

Embodiments may further benefit from high power density in a given cooling environment, capability of series/parallel combinations of power modules to configure high power and voltage at low THD for MVD applications, and high performance by taking advantage of SiC device reduced switching loss.

Figure 2:
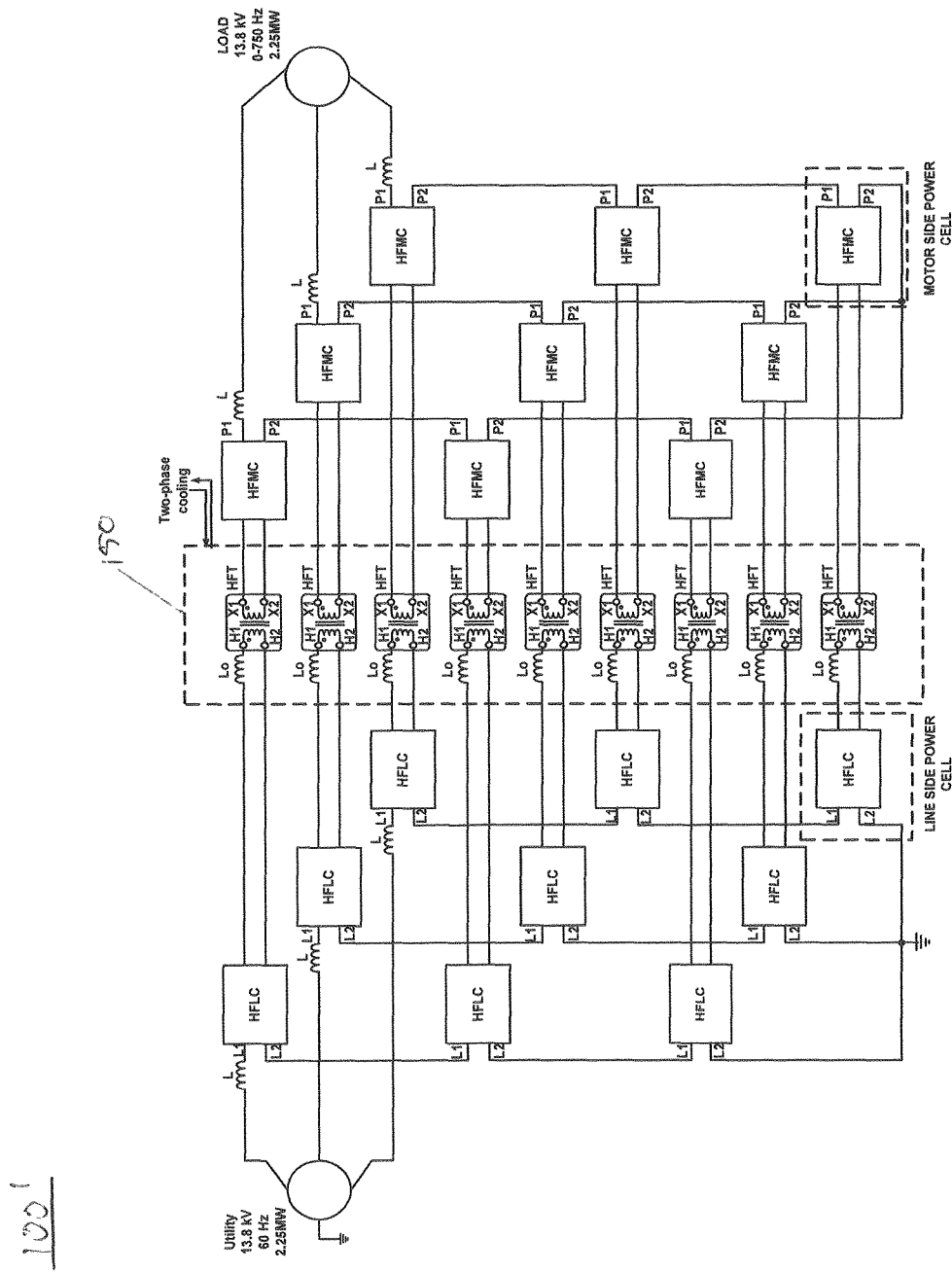
FIG. 2 is a block diagram of another embodiment of a modular medium voltage drive in accordance with an embodiment.

Referring now to FIG. 2, shown is a block diagram of another embodiment of a modular medium voltage drive in accordance with an embodiment. As illustrated in FIG. 2, drive system 100' may be implemented with the same components as in FIG. 1. However, in the embodiment of FIG. 2 a different variation of modularity is provided. Specifically as shown, rather than a power cell configuration in which each power cell module includes HFLC, HFT and HFMC, the embodiment of FIG. 2 provides for HFT stages that are implemented within a dedicated transformer enclosure 150. More specifically as shown in FIG. 2, transformer enclosure 150 may include all HFTs 124 in a dedicated and isolated enclosure, apart from independent HFLCs and HFMCs with which the corresponding HFT 124 are coupled. In other respects, drive system 100' may be implemented the same as discussed above as to FIG. 1.

Figure 3:
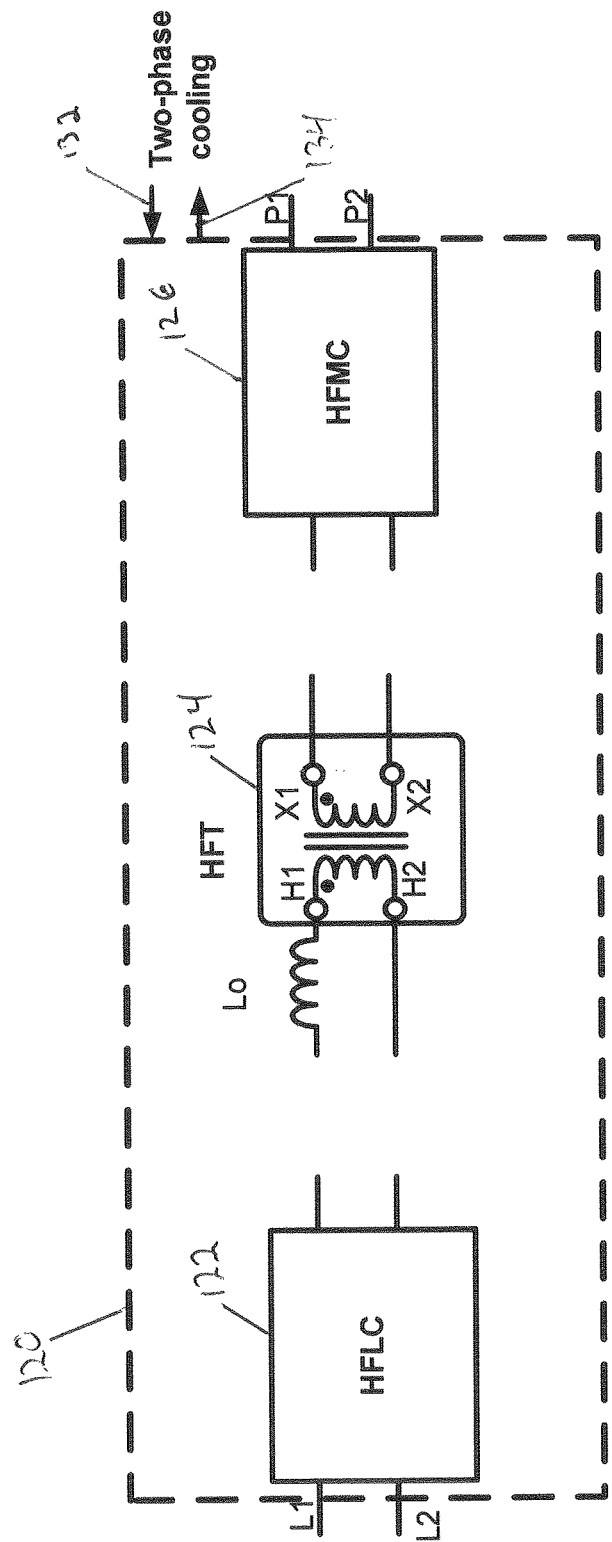
FIG. 3 is a block diagram illustrating further details of a power cell in accordance with an embodiment.

Referring now to FIG. 3, shown is a block diagram illustrating further details of a power cell in accordance with an embodiment. As seen in FIG. 3, power cell 120 includes an HFLC 122, HFT 124 and HFMC 126. In the illustration shown, HFLC 122 is coupled to utility connections and/or additional HFLCs by way of input ports L1 and L2. In turn, the output ports of HFLC 122 couple to input ports of a primary coil of HFT 124 (namely H1 and H2). As illustrated, an input equivalent inductance L0 is coupled to the input port H1. Additional series inductance may be added to provide the target inductance value for optimum power transfer between HFLC and HFMC. HFT 124 further includes a secondary coil having output ports (X1, X2) that in turn couple to input ports of HFMC 126. In turn, the output ports of HFMC 126, namely output ports P1, P2, couple to an output load and/or another HFMC. Via the modularity realized by HFLC and HFMC stages, there is great input/output flexibility.

As further shown in FIG. 3, power cell 120 may be cooled via a two-phase cooling system coupled to the power cell. More specifically, an inlet cooling port 132 and an outlet cooling port 134 provide for communication of a cooling liquid. In turn, heat is transferred to this cooling liquid which may, in some cases, convert in phase to a gas during its traversal within power cell 120. Furthermore, note that power cell 120 may be implemented within an enclosure to provide a large amount of electrical isolation (e.g., an enclosure that provides for, at least, 15 kV of electrical isolation).

Figure 4:
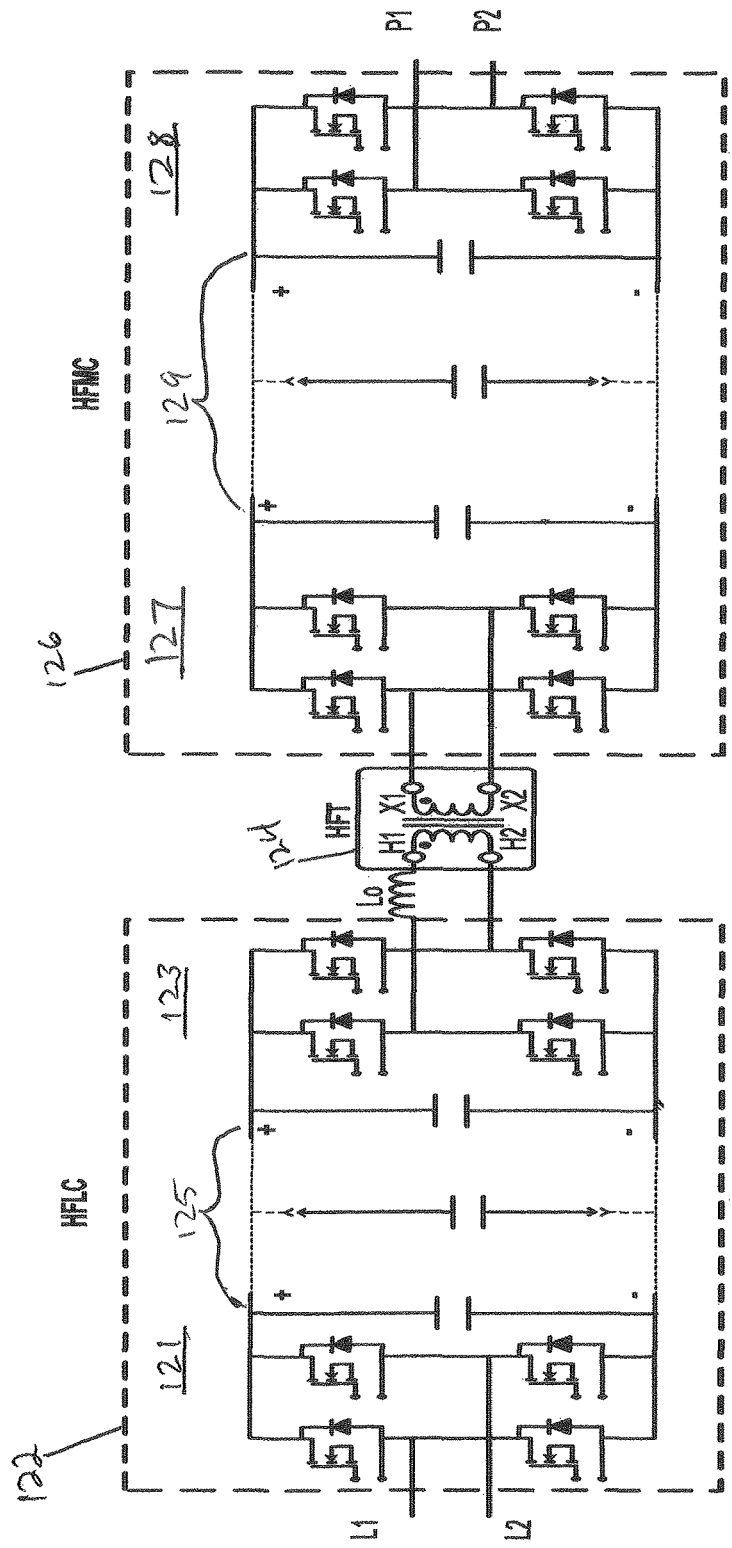
FIG. 4 is a schematic diagram of a power cell in accordance with an embodiment.

Referring now to FIG. 4, shown is a schematic diagram of a power cell in accordance with an embodiment. More specifically as illustrated in FIG. 4, HFLC 122 and HFMC 126 each may be implemented using multiple H-bridge stages. Namely, HFLC 122 includes a first H-bridge stage 121 and a second H-bridge stage 123, each of which may be implemented using SiC switches, or other wide bandgap devices. Of course other implementations are possible, such as junction field effect transistors (JFETs) and gallium nitride (GaN) power devices if device ratings are not exceeded. When connecting to 60 Hz systems (e.g., input/output), insulated gate bipolar transistors (IGBTs) can be used for H-bridge stage 121 and HFMC 126 if loss content is suitable for the application. If the power transfer from utility to load is unidirectional (non-regenerative), silicon (Si) and SiC power diodes can be used for H-bridge stage 121 and HFMC 126 respectively As shown in FIG. 4 specifically, first H-bridge stage 121 is a rectifier to rectify the incoming AC signal into a pulsed DC signal. In turn, second H-bridge 123 is an inverter to convert the DC signal to AC at a given high switching frequency. Although the scope of the present invention is not limited in this regard, in some embodiments this switching frequency may be between approximately 25 kHz-50 kHz. Note that conversion of AC power to DC power may be implemented by way of these multiple stages and further by way of a DC link 125 coupled in parallel between stages 121, 123. Note also that a DC link 125 is coupled in parallel between stages 121, 123.

Figure 6:
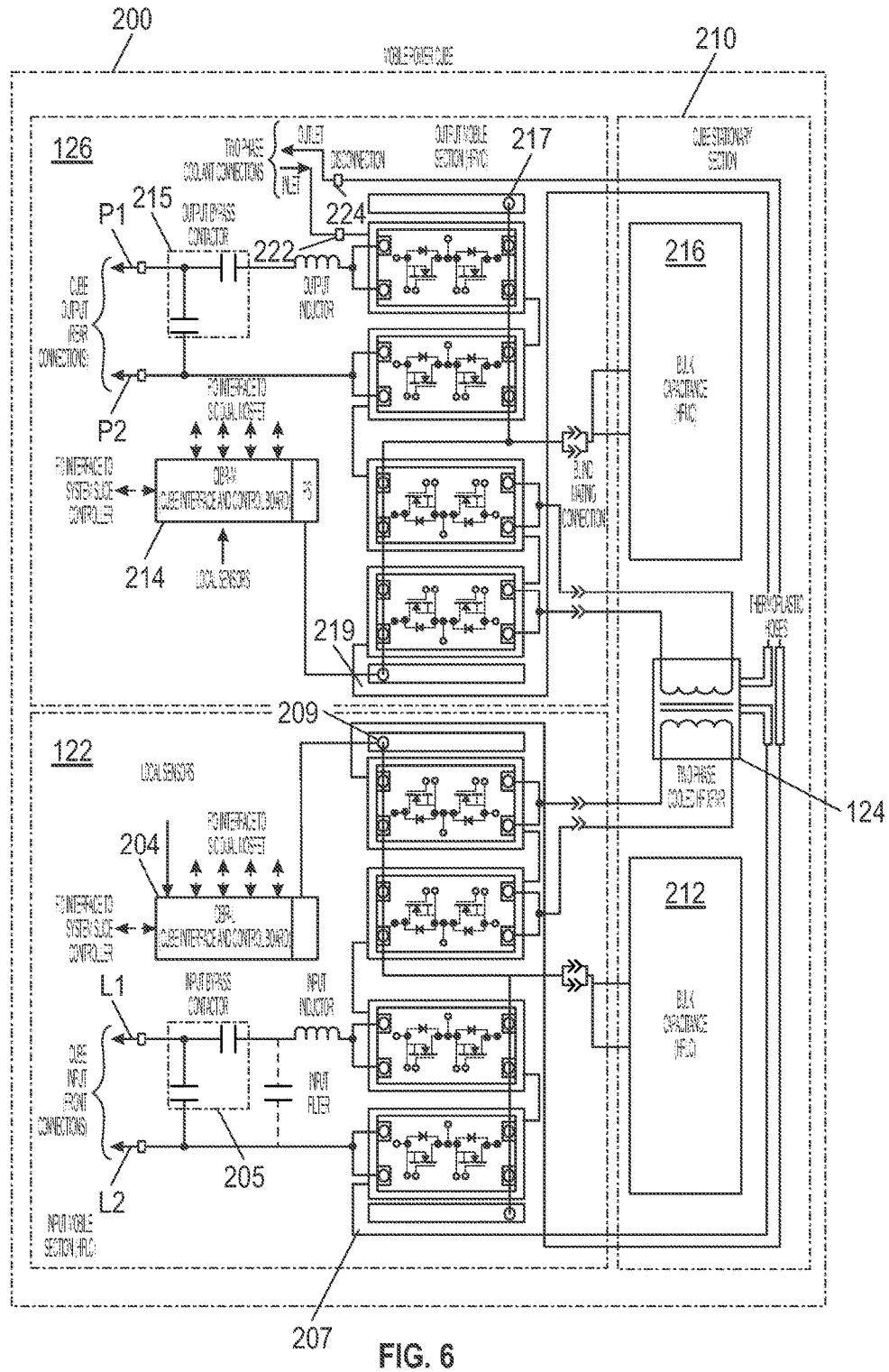
FIG. 6 is a schematic diagram of an implementation of a mobile power cell in accordance with an embodiment.

In turn HFMC 126 includes a first H-bridge stage 127 and a second H-bridge stage 128, each of which may be implemented using SiC switches. Specifically, first H-bridge stage 127 is a rectifier to rectify the incoming AC signal into a pulsed DC signal. In turn, second H-bridge 128 is an inverter to convert the DC signal to AC at a given fundamental frequency (e.g., 750 Hz). Note also that a DC link 129 is coupled in parallel between stages 127, 128. Note that as illustrated in the schematic diagram of FIG. 4, the DC links included within HFLC 122 and HFMC 126 are represented as multiple parallel capacitors. Namely each of these DC links is shown as three separate capacitors in parallel. In a particular embodiment, each DC link may be formed via a bulk capacitance, present in a fixed portion of a power cell, and multiple local capacitances associated with the corresponding HFLC/HFMC in a mobile portion of the power cell. FIG. 6 shows a particular example of a power cell configuration including this combination of bulk and local capacitances.

Using an embodiment as shown in FIG. 4, cell power transfer is achieved via a high frequency transformer link implemented by HFT 124. HFT 124 may operate to modify a voltage level of the incoming signal, such that a given voltage conversion is realized between incoming utility power and output power to a load. In different embodiments, HFT 124 can be implemented as a step-up or step-down transformer (in some cases HFT 124 also may be a unity transformer ratio). As illustrated, single-phase H-bridge stages connect high frequency DC-DC sections to line and motor, respectively. The DC-DC high frequency link section includes components 123, 124 and 127.

Figure 5:
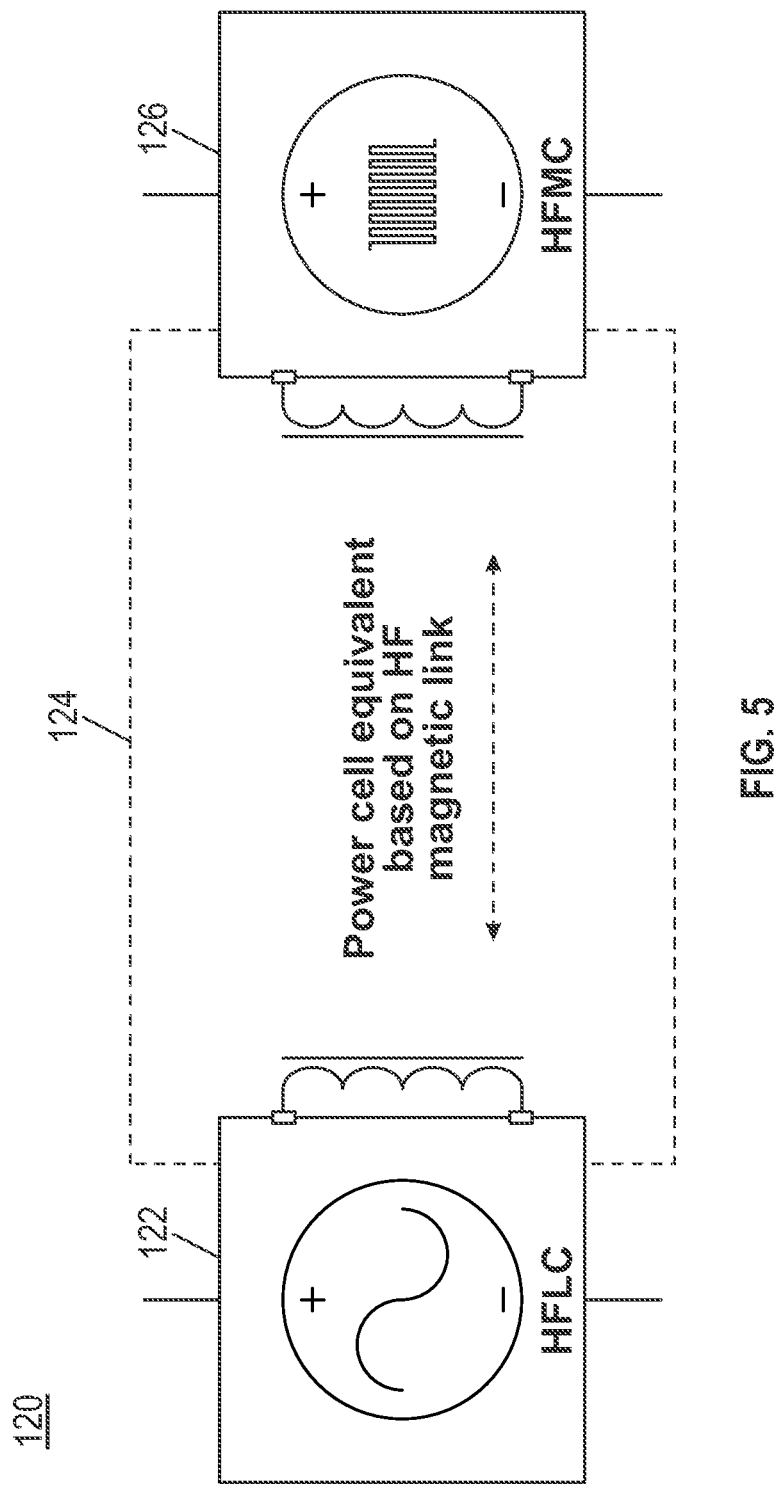
FIG. 5 is a block diagram of a power converter cell equivalent circuit in accordance with an embodiment of the present invention.

Referring now to FIG. 5, shown is block diagram of a power converter cell equivalent circuit in accordance with an embodiment. As seen in FIG. 5, power cell circuit 120 is formed of an HFLC 122 coupled to an HFMC 126 via a high frequency magnetic link 124. More specifically as illustrated, a primary coil of the high frequency magnetic link couples to an output of HFLC 122 and in turn a secondary coil of the high frequency magnetic link couples to the input of HFMC 126. As further illustrated, in general HFLC 122 may receive an incoming AC signal at a given frequency. By provision of the high frequency magnetic link, this incoming signal is transformed to a potentially substantially higher frequency. Thus as illustrated, HFMC 126 receives via the secondary coil an AC signal at a much higher frequency, and outputs the AC signal at yet another frequency. Understand while shown at this high level in FIG. 5, this representation of a power converter cell equivalent circuit can be one of multiple such power cells within a multi-cell drive system.

While above FIGS. 1-5 describe a high level view of high frequency magnetic switching to provide a modular drive system with low complexity and ease of integration, further details are shown with reference to FIG. 6. More specifically, referring now to FIG. 6, shown is a schematic diagram of an implementation of a mobile power cell 200 in accordance with an embodiment. Like numbered elements correspond to the elements of power cell 120 discussed above. Thus as shown, an input mobile section is implemented as HFLC 122 and an output mobile section is implemented as HFMC 126. In embodiments, mobile power cell 200 may include one or more portions that are readily removable/replaceable and at least one portion that is more stationary. In this way, a module or other housing or enclosure that forms the moveable portion can be made to be relatively small and lightweight as compared to a conventional power cell. This allows for greater ease of customer access and removal, repair and replacement operations on these moveable portions of a power cell. In turn, the moveable portion may be plugged into a fixed portion within the power cell chamber. The fixed portion of the chamber may include various components that would conventionally be present in a single power cell enclosure including, for example, a DC link by way of one or more capacitors. As such components can be relatively reliable over a number of years, these components may be located in the fixed portion. As used herein, "fixed" or "stationary" means that a component is physically attached directly within a power cell module, not readily customer accessible, and cannot be inserted and removed by simple pluggable/slidable means. Instead, special access and tools are needed to insert or remove the component. In contrast, "moveable" or "pluggable" means a component or group of components that are easily inserted and removed from a cabinet, e.g., via sliding, plugging and so forth without the need for tools, and having ready customer access. However, understand that the entirety of mobile power cell 200 may be implemented with a size and weight such that it can be installed into and removed from a given enclosure, such as a cabinet of a medium voltage drive as a single unit. In an embodiment, a 7.6 kV medium voltage system enclosure can accommodate 6 power cells in a single cabinet with dimensions of approximately 20 inches wide, 75 inches deep and 79 inches high. The number of system cabinets will depend on system voltage and output power being targeted in a given implementation.

Nevertheless, for greater ease of access to components within HFLC 122 and HFMC 126, these portions may be implemented as relatively small modules readily inserted into and removed from the remainder of power cell 200 by way of quick disconnect/blind mating type connections. Instead, a stationary portion 210 of power cell 200 may include bulkier components (e.g., that may weigh more and be of less likelihood of need for installation/removal), such that they may be fixed within mobile power cell 200. Specifically as shown, stationary portion 210 includes bulk capacitances, including a bulk capacitance 212 associated with HFLC 122 and a bulk capacitance 216 associated with HFMC 126. In embodiments, bulk capacitances 212, 216 may form the DC links of the corresponding converters and may couple to switching components (e.g., SiCs) of HFLC 122, HFMC 126 by way of blind mating connections. In a particular embodiment, capacitances 212, 216 may be formed of film-type capacitors and may have a capacitance of between approximately 3 and 6 milli-farads depending on drive output power.

Also illustrated in FIG. 6, further details of a power cell are illustrated. At an input portion of HFLC 122, an input bypass contactor 205 may be adapted. In an embodiment, bypass contactor 205 may be implemented using capacitors to enable a given cell to be switchably connected into or out of a drive system. In turn, an input filter 208 may couple to first input port L1-L2. As illustrated, input filter 208 may be implemented as an LC filter to provide filtering to reduce harmonics and their effect on a utility. Note that this harmonic-absorbing filter need not be present at output P1-P2, as this output does not couple to the utility. In addition to multiple SiCs that form the input stage and output stage H-bridges, local capacitors 207 and 209 may further be present within HFLC 122.

In embodiments, control of switching within HFLC 122 may be performed by a first controller 204. In embodiments, controller 204 may be implemented as a cell interface and control board. As illustrated, first controller 204 may couple by way of fiber optic interfaces to the dual metal oxide semiconductor field effect transistors (MOSFETs) of the SiCs. In addition, first controller 204 may receive various sensing information from local sensors. Although the scope of the present invention is not limited in this regard, such locally sensed information may include device cold plate temperature, power cell input/output voltage and current, DC link voltage level (e.g., to execute over/under voltage protection actions), state of bypass contactors, feedback fault SiC device signals, and DC power supply monitoring. Still further, an additional fiber optic interface may provide interconnection between first controller 204 and a system slice controller (not shown in FIG. 6) that may provide master control signals on which first controller 204 bases its control.

Similar components may be present in HFMC 126, including an output bypass contactor 215 and an output inductor 217. Note that output inductor 217 may only be present on output port P1 that couples to the load. HFMC 126 further includes a second controller 214, which may operate similarly to that discussed above as to first controller 204, and corresponding local capacitors 217 and 219.

FIG. 6 further shows details regarding communication of cooling media within power cell 200. In embodiments, a multiple-phase cooling system may be used. More specifically, an advanced heat loop design is provided where a fluid/refrigerant is circulated through the loop using vapor pressure generated inside an evaporator, which in an embodiment can be implemented as one or more heat pipes embedded within heat absorbing members. The fluid in the evaporator boils off after absorbing the heat transferred to the evaporator, which in turn generates pressure. The pressure generated by the vapor forces the vapor phase of refrigerant into a condenser, where the vapor is cooled externally by flowing air or liquid over it. The gases are thus condensed in the condenser and returned to the inlet of the evaporator using vapor pressure as well as gravity. In some embodiments, the multiple-phase cooling system may be a passive system, in that as used herein, the term "passive" is used to mean a multiple-phase cooling system in which no pump is present. In other words a pumpless system may be provided in which no active energy is required to drive the fluid and gases inside the loop. Other embodiments may provide one or more pumps in the cooling system.

The cooling system may operate such that when heat is to be dissipated, it is absorbed within cold plates and removed by a two phase mixture of liquid and vapor within the cooling system. More specifically, this coolant may be pure water-based (with high dielectric constant) or it can be a refrigerant such as R-134a that has very high dielectric properties. When the liquid coolant is heated, it transforms into vapor, absorbing all the latent heat, which passes through the conduit structure within the power cell and into a heat exchanger, which performs heat dissipation by cooling this vapor phase with an appropriate coolant (air or liquid), causing the vapor phase to return to a liquid phase. In turn, this liquid transformed in heat exchanger returns through conduits back into the cooling system implemented within the power cell.

In different embodiments heat exchanger implementations can vary. For example, multiple heat exchangers may be provided. A choice of a single or multiple heat exchange system may be based on a location of the drive system. For example, when it is desirable to limit the amount of heat exchange into an ambient environment such as a room in which a drive system is located, it is possible to include a water-based heat exchanger within the drive system itself that in turn can be coupled to an external heat exchanger, which in various implementations can be a water or air-based heat exchanger. Note that the number of heat exchangers depends also upon customer specifications such as availability of a cold water tower, HVAC limitations for the room, size of installation site, and cost for each additional heat exchanger system and so forth.

Specifically in FIG. 6, a series-based communication of cooling flow is illustrated. As seen, a two-phase cooling system provides a flow of cooling liquid via an inlet port 222, which may couple within HFMC 126. As seen, this inlet connection, which may be by way of a quick disconnect-type connection, provides cooling flow to the various SiCs within HFMC 126, and thereafter through transformer 124 to provide cooling of elements of the transformer. Cooling flow continues then to the various SiCs of HFLC 122. From there, heated coolant (which at this point may have been converted to gas phase) may flow through the remainder of the conduits within mobile power cell 120 and then output via an outlet 224. In other implementations rather than this series-based cooling implementation, it is possible to provide a range of cooling options. As one example, a parallel-connected cooling system may be provided in which incoming coolant is provided in parallel to all of HFLC 122, transformer 124 and HFMC 126. In yet another implementation, a hybrid variation can be realized where incoming coolant is provided directly (in series) to HFT 124. Thereafter, a parallel connection may provide coolant flow to HFLC 122 and HFMC 126 in parallel.

Figure 7:
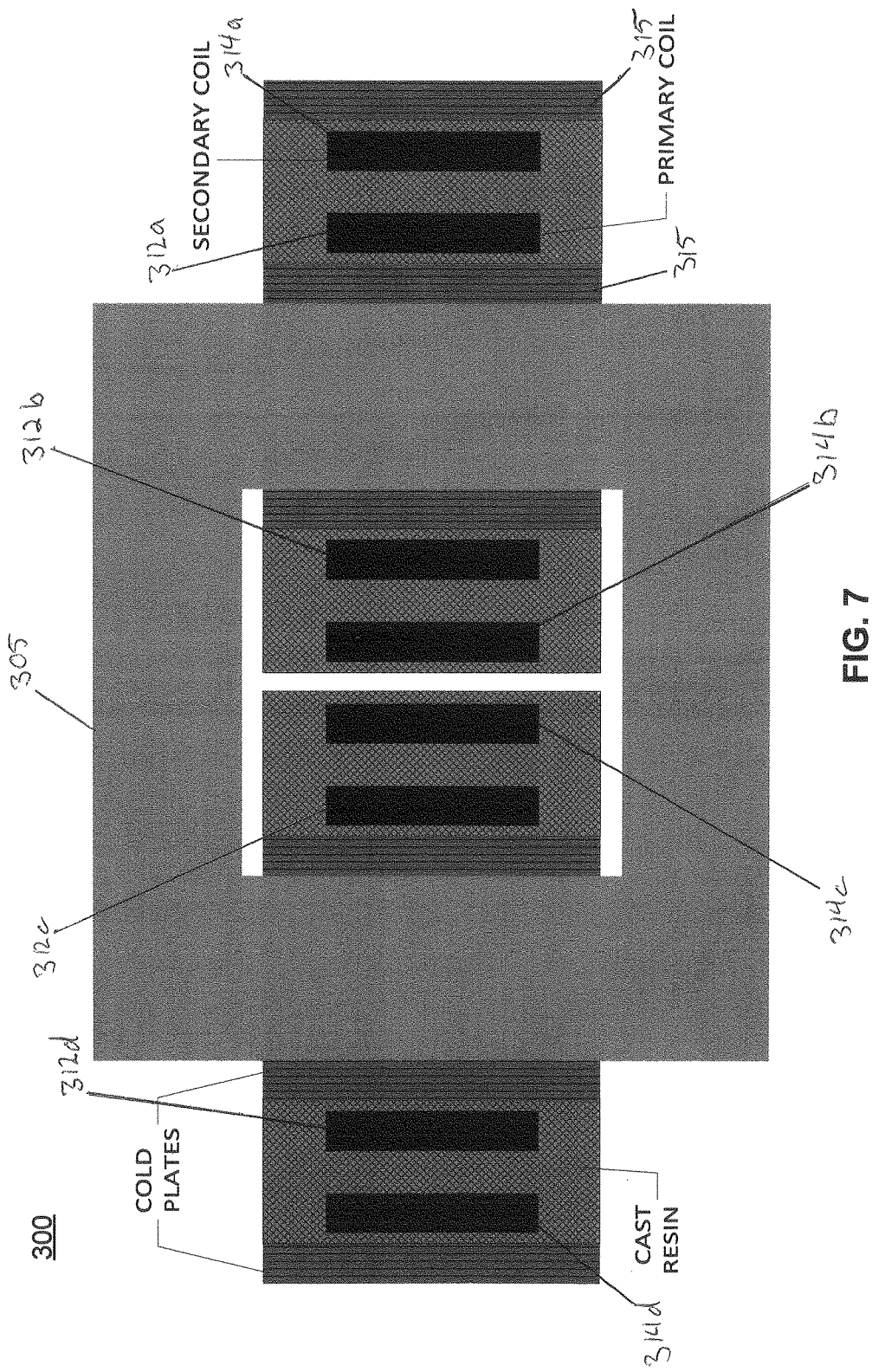
FIG. 7 is a cross-section diagram of a high frequency transformer in accordance with an embodiment.

Referring now to FIG. 7, shown is a cross-section diagram of a high frequency transformer in accordance with an embodiment. More specifically, by providing a high frequency transformer as described herein, greatly reduced transformer size can be realized. In this way, individual transformer modules can be implemented within each of the power cells. As illustrated in FIG. 7, transformer 300 is implemented with a core 305 which may be an iron core. Note that in embodiments, core 305 may be formed of relatively small dimension, e.g., approximately 5-8 inches wide, between approximately 7-10 inches tall and between 2-3 inches deep. Note that in embodiments the window portion of core 305 may have a height of approximately 4-5 inches, in an embodiment.

As further shown, primary and secondary coils of transformer 300 couple around core 305. Specifically, a primary coil is formed of coil portions 312a, 312b (adapted around a first column of coil 305), to which a first input port (e.g., H1 in the embodiment of FIG. 1) may couple and coil portions 312c, 312d (adapted around a second column of core 305) (and to which input port H2 of FIG. 1 may couple). As further illustrated in FIG. 7, a secondary coil formed of coil portions 314a, 314b, 314c and 314d may couple to output ports X1, X2 (in FIG. 1). Note further that a plurality of cold plates 315 may be adapted about core 305 and about secondary coil 314 to provide cooling support by way of the two-phase cooling system. Furthermore, to provide electrical isolation between primary and secondary coils, an insulative material 316, which in an embodiment may be a cast resin such as MICARES™, can be provided. Understand while shown with this particular implementation, many variations and alternatives are possible.

Figure 8:
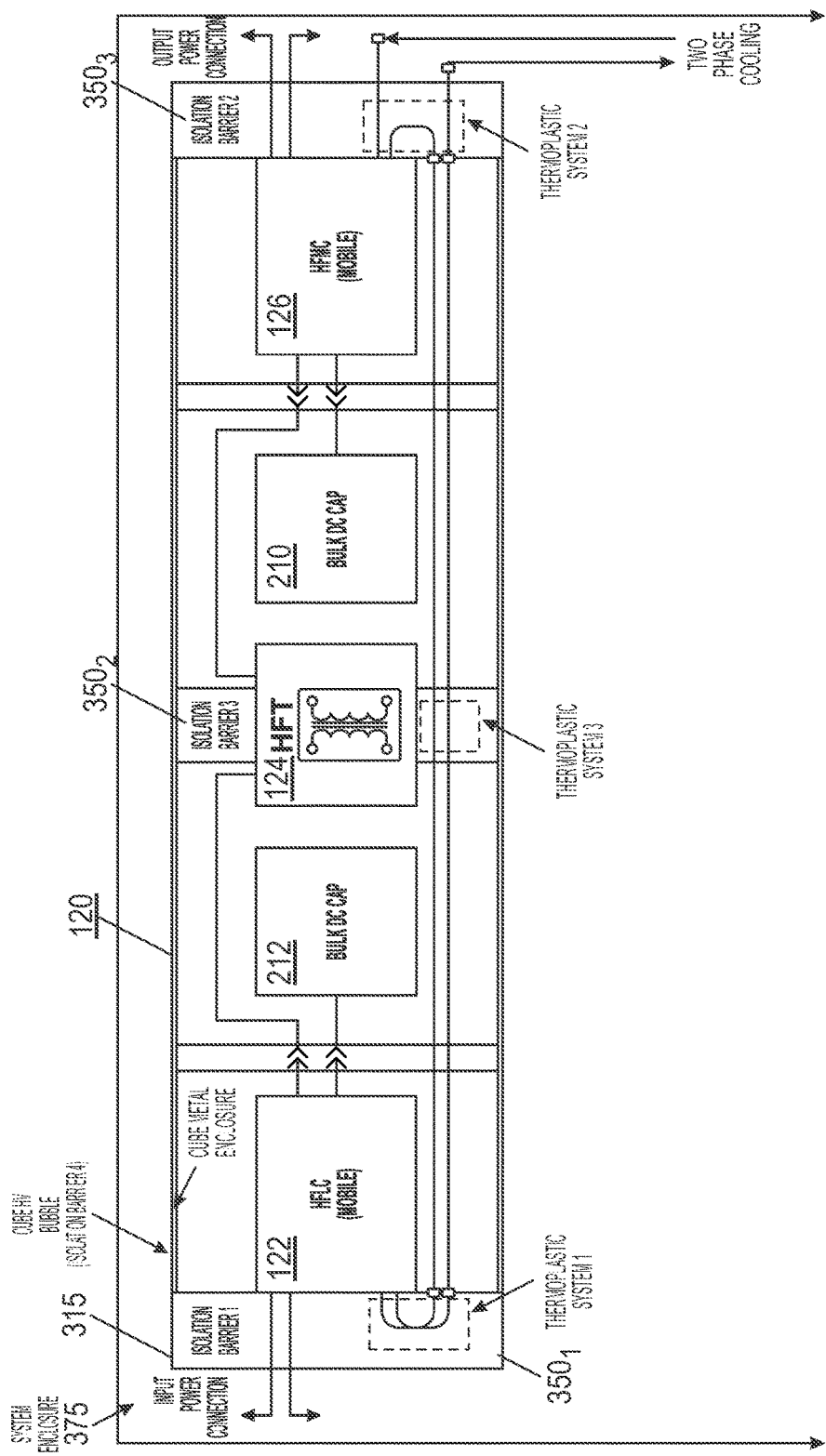
FIG. 8 is a block diagram of a power cell that demonstrates various isolation/insulation in accordance with an embodiment of the present invention.

Referring now to FIG. 8, shown is a block diagram of a power cell that demonstrates various isolation/insulation in accordance with an embodiment of the present invention. Power cell 120 is shown (from left to right) from a front portion to a rear portion. As seen, power cell 120 includes HFLC 122, HFMC 126, corresponding bulk capacitors 212, 216 and HFT 124. The components of power cell 120 may be adapted within a given cell enclosure. Specifically with reference to FIG. 8, power cell 120 may be implemented within a metal enclosure that houses the above-described components of the power cell.

A first measure of isolation is realized by the spatial separation between these components. Furthermore, a plurality of isolation barriers $350_1$-$350_3$ may be implemented within power cell 120 to provide isolation between the components within power cell 120 as well as providing isolation between other power cells and other components of a drive system. In embodiments, isolation barriers 310 may be implemented using a combination of air, FORMEX™ and GPO-3 insulation materials. Still further, these isolation barriers may include internal thermoplastic barriers that provide insulation for cooling connections and conduits that traverse between the different components.

As a further measure of isolation, an additional isolation barrier 365 may be implemented about an enclosure of power cell 120. In embodiments, isolation barrier 365 may be implemented as a so-called bubble that may be implemented. Isolation barrier 365 can be formed using an insulative material such as a polypropylene or other plastic or other such material, to provide electrical isolation between the power cells and other equipment. Isolation barrier 365 may be formed of a plurality of individual members in an interlocking manner or single member to provide efficient isolation. In various embodiments, isolation barrier 365 may be formed of sheets of an insulating material such as FORMEX™ or other such material. In some embodiments many such members, e.g., 2 or many more may be provided, as these individual members can be of relatively thin width, e.g., 9.8 to 125.2 mils. In this way, an insulating bubble is formed around each power cell to facilitate voltage insulation. Such insulation may enable a single generic cabinet architecture to be used with a wide variety of voltages, from low voltage applications all the way up to high voltage applications. Generally as the voltage application increases, the number of sheets and thus relative thickness may also increase. Further, while not shown for ease of illustration in FIG. 8, understand that spacers may be present to provide separation of the individual power cell modules from a base over which they are situated. Finally, note that power cell 120 is implemented within a system enclosure 375 such as a cabinet of a drive system.

Figure 9:
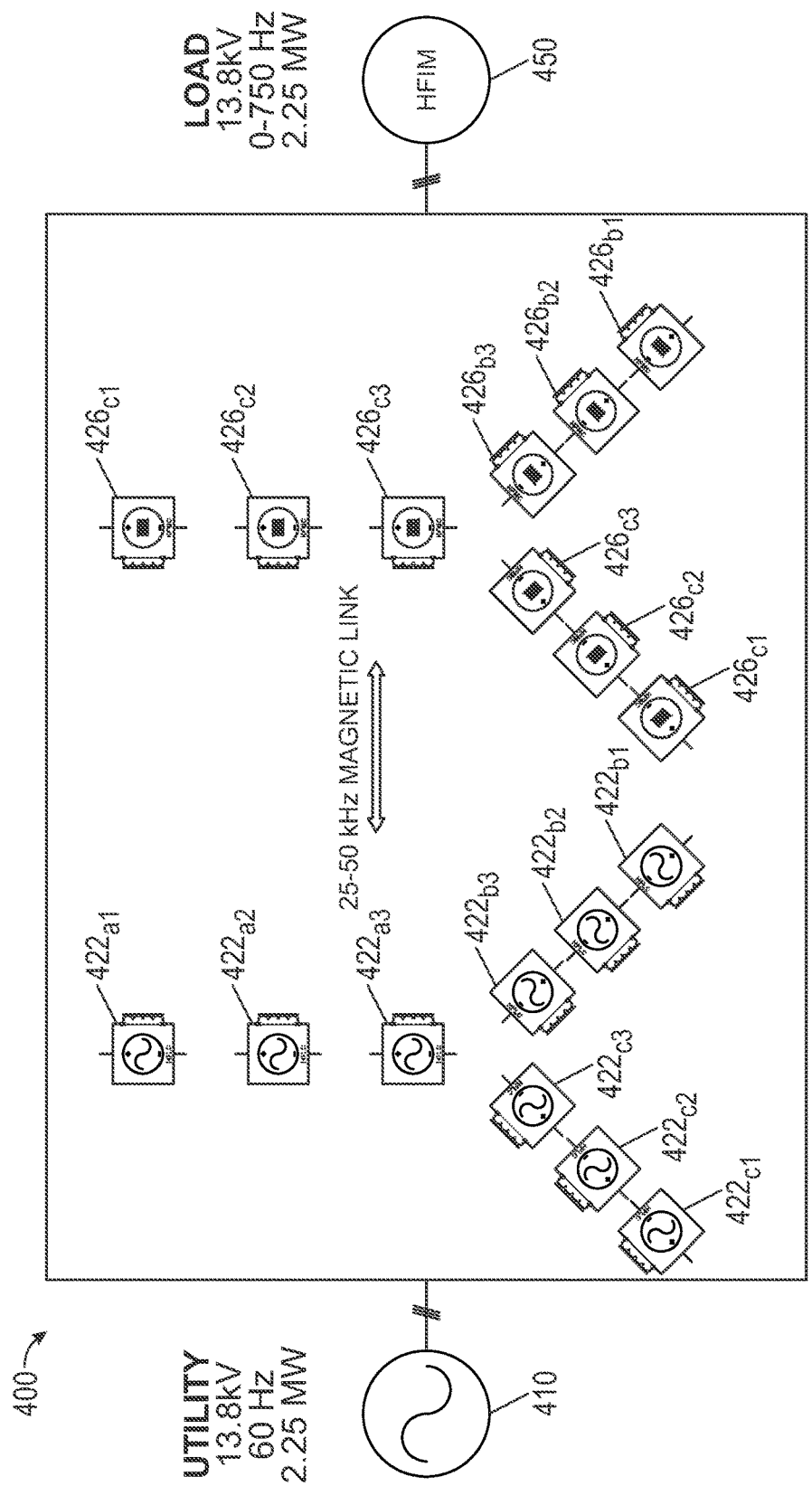
FIG. 9 is a high level schematic diagram of a system in accordance with an embodiment.

Referring now to FIG. 9, shown is a high level schematic diagram of a system in accordance with an embodiment. More specifically as shown in FIG. 9, a medium voltage drive system 400 couples between a utility source 410 and a load 450. In the embodiment shown, utility source 410 may operate at 13.8 kV, 60 Hz and provide a power of 2.25 megawatts (MW). In turn, load 450 may be implemented as a high speed induction motor (HFIM) that operates at 13.8 kV, and consumes a 2.25 MW of power. As illustrated, depending upon the particular motor, this load can operate anywhere from 0-750 Hz. As such, drive system 400 may provide a power conversion to condition incoming AC power at 60 Hertz to a potentially different AC level.

As described above in various embodiments, a high frequency magnetic link may couple input-side HFLCs and output-side HFMCs. In the illustration of FIG. 9, a variable high frequency magnetic link thus may be realized between corresponding HFLCs 422 and HFMCs 426. More specifically, a slice arrangement is illustrated where multiple HFLCs 422 of corresponding phases (namely HFLCs $422_{a1\text{-}a3}$, $422_{b1\text{-}b3}$, and $422_{c1\text{-}c3}$) may be magnetically coupled to corresponding HFMCs 426 (namely HFMCs $426_{a1\text{-}a3}$, $426_{b1\text{-}b3}$, and $426_{c1\text{-}c3}$). Note that the frequency at which the magnetic link operates is based on control of the switching devices on H-bridges within the HFLCs and HFMCs, the amount of power to be transferred through the HFT, device switching loss, HFT design parameters such as transformer voltage ratio, loss content, magnetic flux level, and targeted dimensions, among others. Additionally, the line and motor converter's RMS power cell voltage may be selected to meet incoming utility power and voltage and the frequency and voltage of the load power. In this schematic illustration, HFT primary and secondary sides are shown as coupled to corresponding HFLCs and HFMCs, demonstrating the electronic transformer switching.

As further shown in FIG. 9, virtual slices or collections of conversion elements can be formed for control purposes. As one example, phase-based slicing may occur where in FIG. 9, three series power cells per slice are present. More specifically, a first slice may be formed of HFLCs $422_{a1}$, $422_{b1}$, $422_{c1}$ and corresponding HFMCs $426_{a1}$, $426_{b1}$, $426_{c1}$. A second slice may be formed of HFLCs $422_{a2}$, $422_{b2}$, $422_{c2}$ and corresponding HFMCs $426_{a2}$, $426_{b2}$, $422_{c2}$. In turn, a third slice may be formed of HFLCs $422_{a3}$, $422_{b3}$, $422_{c3}$ and corresponding HFMCs $426_{a3}$, $426_{b3}$, $426_{c3}$. Note that each pair of corresponding HFLC 422 and HFMC 426 may be implemented within a given power cell. In this way, for control purposes, each slice may be formed of multiple power cells. In one implementation, a power cell enclosure method is to locate all power cells of phase A in one cabinet followed by phase B and phase C. Each enclosure can house up to six power cell modules. To accommodate a particular system's requirements, multiple power cell cabinets can be provided, e.g., as indicated in Table 1 and FIG. 10, described below. In some cases all of the power cells may be implemented within a single cabinet enclosure that houses the complete drive system. In other cases, multiple cabinets may be used to house a drive system.

Using a drive system as in FIG. 9, great flexibility may be realized, in that different combinations of individual HFLCs and HFMCs can be provided, depending upon power requirements. Furthermore, different coupling of multiple ones of these HFLCs/HFMCs may be realized. For example, in different embodiments serial input and serial output devices may be provided. In other cases parallel-input and parallel-output devices may be provided. In yet other combinations, serial-input and parallel-output or parallel-input and serial-output device configurations are possible. Furthermore, based upon the voltage ratings of included switching components (e.g., SiCs within the converter modules), different voltages can be realized. Thus while FIG. 9 illustrates an example embodiment with three series-coupled HFLCs and three-series-coupled HFMCs per phase, more or fewer modules may be present in other embodiments.

Figure 10:
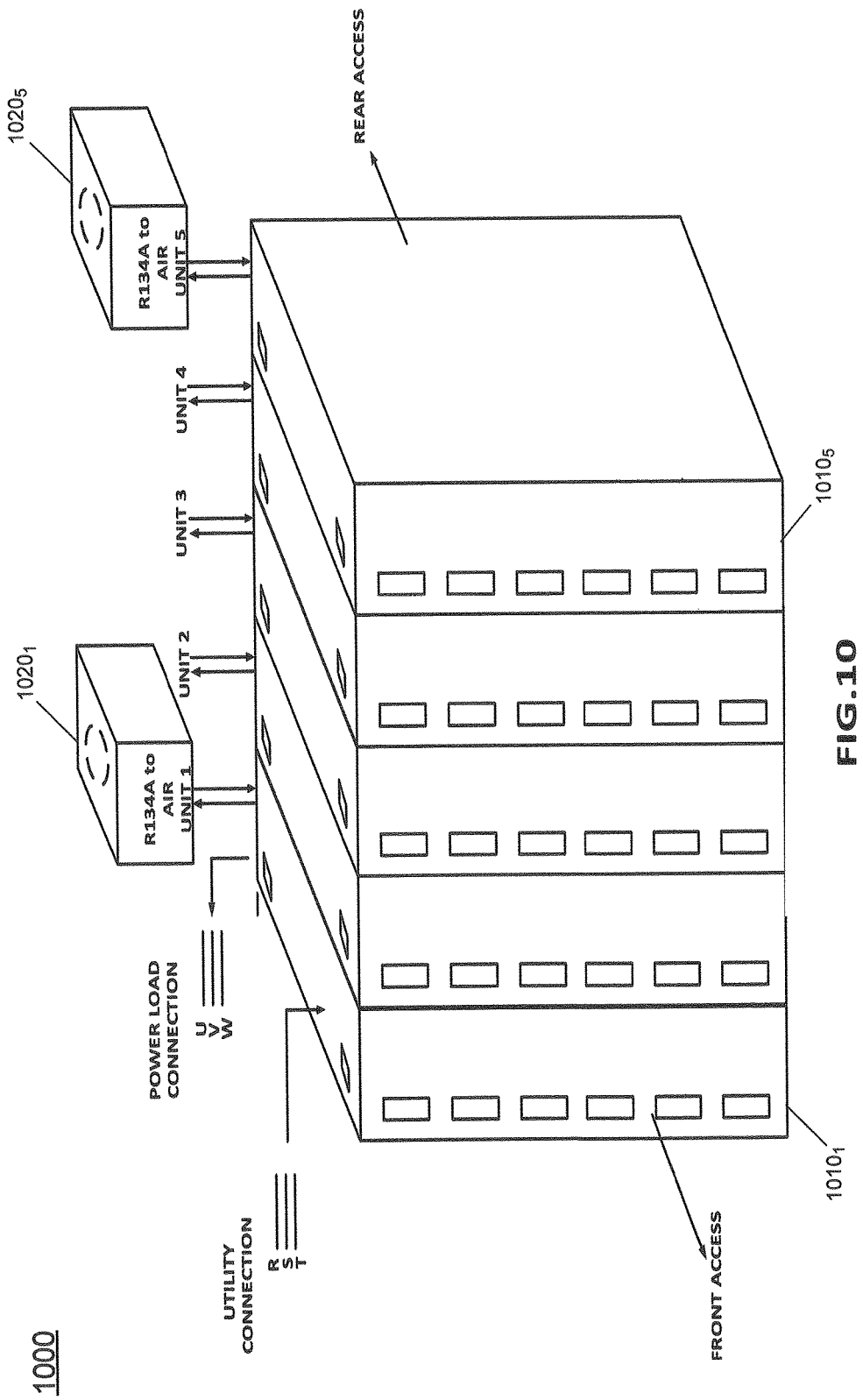
FIG. 10 is a plan drawing of a medium voltage drive system in accordance with an embodiment

Referring now to FIG. 10, shown is a plan drawing of a medium voltage drive system in accordance with one embodiment. As shown in FIG. 10, drive system 1000 includes multiple cabinets $1010_1$-$1010_5$. Each cabinet 1010 is configured to house multiple power cell modules, each such power cell module including an HFLC, a high frequency transformer, and an HFMC. Understand that in different implementations different numbers of cabinets and/or numbers of power cells within cabinets may be realized.

As further illustrated in FIG. 10, each cabinet 1010 may couple to a corresponding condenser unit $1020_1$-$1020_5$ of a two-phase cooling system In an embodiment, drive system 1000 may be configured with one or more cabinets 1010. In a particular example, the cabinets may have dimensions having a width between approximately 19-22 inches, a height between approximately 78-82 inches, and a depth of approximately 70-72 inches.

Referring now to Table 1, shown are representative characteristics of a variety of medium voltage drive systems that may be realized using one or more cabinets adapted as in FIG. 10. As seen in Table 1, for a medium voltage drive system having an output power of 1.5 MW and a system voltage of 7.6 kV, a single cabinet may be provided having 6 power cells. To this end, each of three phases may be adapted as two series-connected HFLCs, corresponding HFTs and two HFMCs coupled in series.

To increase power capabilities (and system voltage), with two cabinets an output power of 3.0 MW can be realized by coupling four power cells in series. To realize even higher output power levels, additional cabinets having additional power cells can be configured such that multiple parallel branches (either connected in WYE or delta configurations) couple in parallel with each branch having four power cells in series. For example, for an output power of 9.0 MW, three parallel branches may be provided at input and output, with each of these three branches having four power cells coupled in series.

TABLE 1

| System voltage | 7.6 kV | 13.8 kV | 13.8 kV | 13.8 kV |
|---|---|---|---|---|
| No. of power cells | 6 | 12 | 24 | 36 |
| No. of cabinets | 1 | 2 | 4 | 5 |
| Output power (MW) | 1.5 | 3.0 | 6.0 | 9.0 |

Referring now to FIG. 11A, shown is a plan drawing of a medium voltage drive system in accordance with an embodiment. As shown in FIG. 11A, drive system 1100 includes three separate cabinets. More specifically, cabinet 1120 is configured to house multiple high frequency transformers as described herein. In turn, separate cabinets 1110, 1130 are provided to house HFLCs and HFMCs as described herein. In the high level shown in FIG. 11A, cabinet 1110 receives input power from a utility connection, and similarly provides output power via a power load connection. As further illustrated, each cabinet may couple to a two-phase cooling system by various conduits. In the representation shown, a parallel coupling to the cooling system is provided, with liquid coolant incoming and heated coolant (e.g., in a vapor phase) provided back to the cooling system. As such, each of cabinets 1110-1130 may be coupled in parallel to an external exchange condenser unit such as a centralized condenser unit provided with R134A-to-air or R134A-to-water to perform heat exchange.

In the embodiment of FIG. 11A, cabinets 1110 may be implemented as relatively smaller cabinets than in the embodiment of FIG. 10. For example, in an embodiment, each cabinet may have a width of between approximately 19-22 inches, a height of between approximately 78-82 inches, and a depth of approximately 30 inches. This is the case, as front access only is provided, and each cabinet may be adapted to house only one of HFLCs, HFTs and HFMCs.

With reference to the block diagram of FIG. 11B, in a particular implementation, a large plurality of HFLCs and HFMCs may be provided. More specifically, FIG. 11B shows a top view of a system including 15 cabinets. More specifically, 6 cabinets may be adapted to house HFLCs, 6 cabinets adapted to house HFMCs, and three cabinets adapted to house transformers. As will be described further below, this arrangement may enable an output power of 9.0 MW with a system voltage of 13.8 kV. In HFT cabinets, windings connected to the line (namely the utility or primary coils) can be located on the same side of a cabinet and load connections (secondary coils) on the other side, to maintain electrical isolation between line and load sides. Thus as illustrated in FIG. 11B, transformers 124 are adapted respectively in the different cabinets with load side coils on one side of the cabinet and motor side coils on the other side of the cabinet. Note also that the top view of FIG. 11B shows a single vertical level and thus single power cell/HFT per cabinet. Understand that in accordance the arrangement of cabinets in FIG. 11A, 6 such power cells/HFTs may be vertically adapted within a single cabinet.

Referring now to Table 2, shown are representative characteristics of a variety of different medium voltage drive systems in accordance with different embodiments.

TABLE 2

| | System voltage | | | | | |
|---|---|---|---|---|---|---|
| | 7.6 kV | 7.6 kV | 7.6 kV | 13.8 kV | 13.8 kV | 13.8 kV |
| No. of power HFTs | 6 | 12 | 18 | 12 | 24 | 36 |
| No. of power cells | 12 | 24 | 36 | 24 | 48 | 72 |
| No. of power cell cabinets | 2 | 4 | 6 | 4 | 8 | 12 |
| No. of HFT cabinets | 1 | 1 | 2 | 1 | 2 | 3 |
| Output power (MW) | 1.5 | 3.0 | 4.5 | 3.0 | 6.0 | 9.0 |

As illustrated in Table 2, the first column represents an arrangement as in FIG. 11A to provide an output power of 1.5 MW. Here, a system building block with these three cabinets is implemented using 12 power cells (where each power cell includes only a single HFLC or HFMC). To realize this output power, two input power cells (namely HFLCs) may be coupled in series and similarly two output power cells (namely HFMCs) may couple in series. To increase output power to 3.0 MW, two parallel branches (e.g., connected in a WYE or delta fashion) may be implemented, with each branch having two series-connected input power cells and two series-connected output power cells. Increasing output power to 4.5 MW can be realized by providing three parallel branches.

To realize a system voltage of 13.8 kV and output power of 3.0 MW, a building block arrangement may be provided having four input power cells coupled in series and similarly four output power cells coupled in series. This building block may be extended to multiple branches connected in parallel to obtain even higher output power.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
 a power cell module comprising:
  a high frequency line converter (HFLC) to receive a phase of input power from a utility source, the HFLC including a first silicon carbide (SiC) stage and a second SiC stage;
  a transformer having a primary coil coupled to the HFLC and a secondary coil coupled to a high frequency motor converter (HFMC);
  the HFMC to output a phase of output power to a load, the HFMC including a third SiC stage and a fourth SiC stage; and
  a two-phase cooling system having conduits that are adapted to provide a flow of cooling media through the HFLC, the transformer and the HFMC.

2. The apparatus of claim 1, wherein the power cell module comprises a fixed portion including the transformer, a first capacitor associated with the HFLC, and a second capacitor associated with the HFMC.

3. The apparatus of claim 2, wherein the power cell module further comprises a moveable portion comprising:
 the HFLC; and
 the HFMC.

4. The apparatus of claim 3, wherein the HFLC is adapted within a front portion of the power cell module and the HFMC is adapted within a rear portion of the power cell module.

5. The apparatus of claim 1, wherein the apparatus comprises a drive system comprising a plurality of power cell modules, the drive system to receive the input power from the utility source at a first frequency and to output the output power to the load at a second frequency.

6. The apparatus of claim 5, wherein the plurality of power cell modules are each adapted within an insulative housing.

7. The apparatus of claim 1, wherein the two-phase cooling system is configured to provide the flow of cooling media to the transformer and thereafter in parallel to the HFLC and the HFMC.

8. The apparatus of claim 1, wherein the two-phase cooling system is configured to provide the flow of cooling media in series to the HFMC, the transformer and the HFLC.

9. The apparatus of claim 1, wherein the power cell module comprises a first isolation barrier adapted about the transformer, the first isolation barrier comprising an insulation material within which a portion of the conduits of the two-phase cooling system is routed.

10. The apparatus of claim 9, wherein the first isolation barrier further comprises another insulation material adapted about a primary coil of the transformer and a secondary coil of the transformer.

11. The apparatus of claim 9, wherein the power cell module further comprises:
 a second isolation barrier adapted to the HFLC, the second isolation barrier comprising the insulation material through which a portion of the conduits of the two-phase cooling system is routed; and
 a third isolation barrier adapted to the HMLC, the third isolation barrier comprising the insulation material through which a portion of the conduits of the two-phase cooling system is routed.

12. The apparatus of claim 1, wherein the transformer comprises:
 a core having a first column and a second column, wherein a first cold plate of the two-phase cooling system is adapted about the first column, a first coil portion of the primary coil is adapted about the first cold plate, a first coil portion of the secondary coil is adapted about the first coil portion of the first coil, and a second cold plate is adapted about the first coil portion of the secondary coil.

13. An apparatus comprising:
 a first cabinet including a plurality of high frequency line converters (HFLCs) each to receive a phase of input power from a utility source and comprising a wide bandgap stage and a second wide bandgap stage;
 a second cabinet including a plurality of high frequency transformers each having a primary coil coupled to one of the plurality of HFLCs and a secondary coil, the second cabinet having at least one conduit adapted about the plurality of high frequency transformers to receive a flow of coolant from a two-phase cooling system; and
 a third cabinet including a plurality of high frequency motor converters (HFMCs) each to receive a phase of output power from the secondary coil of one of the plurality of high frequency transformers and to output the phase of output power to a load, each of the plurality of HFMCs comprising a third wide bandgap stage and a fourth wide bandgap stage.

14. The apparatus of claim 13, wherein a first portion of the plurality of HFMCs are coupled in series to receive a first phase of the input power from the utility source, a second portion of the plurality of HFLCs are coupled in series to receive a second phase of the input power from the utility source, and a third portion of the plurality of HFLCs are coupled in series to receive a third phase of the input power from the utility source.

15. The apparatus of claim 14, wherein a first portion of the plurality of HFMCs are coupled in parallel to receive a first phase of the output power, a second portion of the plurality of HFMCs are coupled in parallel to receive a second phase of the output power, and a third portion of the plurality of HFMCs are coupled in parallel to receive a third phase of the output power.

16. The apparatus of claim 13, further comprising the two-phase cooling system coupled to the first cabinet, the second cabinet and the third cabinet.

17. The apparatus of claim 16, wherein the two-phase cooling system is coupled in parallel to the first, second and third cabinets.

18. A power cell for a drive system, the power cell comprising:
- a first mobile portion including a first rectifier stage to rectify an input signal of a phase of input power received at a first frequency to provide a first rectified signal and a first inverter stage having a plurality of switching devices to receive a first DC signal and output a first AC signal at a second frequency, wherein the first mobile portion is slidably adapted within a first face of a cabinet of the drive system;
- a fixed portion including a first DC link having a first capacitor to receive the first rectified signal and provide the first DC signal to the first inverter stage and a transformer having a primary coil to receive the first AC signal at the second frequency and a secondary coil to output the first AC signal at the second frequency;
- a second mobile portion including a second rectifier stage to rectify the first AC signal at the second frequency to provide a second rectified signal and a second inverter stage having a plurality of switching devices to receive a second DC signal and output a second AC signal at a third frequency to a load, wherein the second mobile portion is slidably adapted within a second face of the cabinet, and wherein the fixed portion further includes a second DC link having a second capacitor to receive the second rectified signal and provide the second DC signal to the second inverter stage; and
- a conduit system adapted through the first mobile portion, the second mobile portion and the fixed portion, wherein the conduit system comprises an inlet port to receive a flow of liquid coolant and an outlet port to output a flow of two-phase coolant.

19. The power cell of claim 18, wherein the power cell is to output the second AC signal at a substantially higher frequency than the first AC signal.

20. The power cell of claim 18, wherein the power cell comprises:
- a first isolation barrier adapted about the transformer, the first isolation barrier comprising a thermoplastic portion within which a first portion of the conduit system is routed;
- a second isolation barrier adapted to the first mobile portion, the second isolation barrier comprising a thermoplastic portion through which a second portion of the conduit system is routed; and
- a third isolation barrier adapted to the second mobile portion, the third isolation barrier comprising a thermoplastic portion through which a third portion of the conduit system is routed.

* * * * *